(12) United States Patent
Zhang

(10) Patent No.: US 9,882,025 B1
(45) Date of Patent: Jan. 30, 2018

(54) METHODS OF SIMULTANEOUSLY FORMING BOTTOM AND TOP SPACERS ON A VERTICAL TRANSISTOR DEVICE

(71) Applicant: GLOBALFOUNDRIES Inc., Grand Cayman (KY)

(72) Inventor: John H. Zhang, Altamont, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/281,227

(22) Filed: Sep. 30, 2016

(51) Int. Cl.
H01L 21/48 (2006.01)
H01L 29/66 (2006.01)
H01L 29/786 (2006.01)
H01L 29/423 (2006.01)

(52) U.S. Cl.
CPC .. *H01L 29/66666* (2013.01); *H01L 29/42392* (2013.01); *H01L 29/66545* (2013.01); *H01L 29/78618* (2013.01); *H01L 29/78642* (2013.01); *H01L 29/78696* (2013.01)

(58) Field of Classification Search
CPC ... H01L 21/4853; H01L 21/565; H01L 25/50; H01L 25/0657; H01L 23/18; H01L 23/3114
See application file for complete search history.

(56) References Cited

U.S. PATENT DOCUMENTS

| 5,140,388 A * | 8/1992 | Bartelink ............ H01L 21/8221 257/369 |
| 5,342,797 A | 8/1994 | Sapp et al. |
| 5,414,289 A | 5/1995 | Fitch et al. |
| 6,372,559 B1 | 4/2002 | Crowder et al. |
| 6,475,857 B1 * | 11/2002 | Kim ...................... H01L 27/105 257/E21.682 |
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |

(Continued)

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.

(Continued)

*Primary Examiner* — (Vikki) Hoa B Trinh
(74) *Attorney, Agent, or Firm* — Amerson Law Firm, PLLC

(57) ABSTRACT

One illustrative method disclosed herein includes, among other things, forming a gate structure around a vertically oriented channel semiconductor structure above a bottom source/drain (S/D) region and below a top source/drain (S/D) region, the gate structure comprising a gate electrode and a gate insulation layer, a first portion of the gate insulation layer being positioned between the gate electrode and the vertically oriented channel semiconductor structure, removing second portion and third portions of the gate insulation layer while leaving at least some of the first portion in position to define a top spacer recess and a lower spacer recess and performing a common deposition process to simultaneously form a top spacer in the top spacer recess and a lower spacer in the lower spacer recess.

15 Claims, 19 Drawing Sheets

(56) References Cited

U.S. PATENT DOCUMENTS

| | | | |
|---|---|---|---|
| 7,342,273 B2 * | 3/2008 | Cho | H01L 21/28525 257/296 |
| 7,465,622 B2 | 12/2008 | Lin | |
| 7,666,733 B2 | 2/2010 | Delconibus | |
| 7,700,432 B2 | 4/2010 | Chaudhry et al. | |
| 8,637,849 B2 | 1/2014 | Deligianni et al. | |
| 9,177,785 B1 | 11/2015 | Kelly et al. | |
| 9,224,840 B2 | 12/2015 | Flachowsky et al. | |
| 9,278,362 B2 | 3/2016 | Basu et al. | |
| 9,385,195 B1 | 7/2016 | Zhang | |
| 9,660,028 B1 | 5/2017 | Cheng et al. | |
| 2003/0047749 A1 | 3/2003 | Chaudhry et al. | |
| 2003/0119237 A1 | 6/2003 | Chittipeddi et al. | |
| 2007/0111414 A1 | 5/2007 | Chaudhry et al. | |
| 2009/0085088 A1 | 4/2009 | Takaishi | |
| 2011/0253981 A1 | 10/2011 | Rooyackers et al. | |
| 2013/0341270 A1 | 12/2013 | Kar et al. | |
| 2014/0353593 A1 | 12/2014 | Smets | |
| 2015/0091100 A1 | 4/2015 | Xie et al. | |
| 2015/0137271 A1 | 5/2015 | Cai et al. | |
| 2016/0005850 A1 | 1/2016 | Zhao et al. | |
| 2016/0284712 A1 | 9/2016 | Liaw | |

OTHER PUBLICATIONS

Notice of Allowance from related U.S. Appl. No. 15/097,574 dated Sep. 14, 2016.
Notice of Allowance from related U.S. Appl. No. 15/097,621 dated Sep. 19, 2016.
Notice of Allowance from related U.S. Appl. No. 15/132,383 dated Jul. 21, 2017.

* cited by examiner

METHODS OF SIMULTANEOUSLY FORMING BOTTOM AND TOP SPACERS ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of simultaneously forming bottom and top spacers on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12. As indicated in the right-hand portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. The formation of vertical transistor devices can present some special challenges. For example, it may be very difficult to control the thickness (in the vertical direction) of the top and bottom spacers since they are typically formed at different points in time when performing at least some prior art processing techniques. Yet another problem posed when manufacturing vertical transistor devices is that the top source/drain region is typically formed after the gate structure for the device is formed, which means that the thermal budget associated with the formation of the top source/drain region also impacts the previously formed gate structure, which can lead to undesirable changes and/or variations in the threshold voltage or reliability characteristics of the vertical transistor device.

The present disclosure is directed to methods of simultaneously forming bottom and top spacers on a vertical transistor device that may solve or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of simultaneously forming bottom and top spacers on a vertical transistor device. One illustrative method disclosed herein includes, among other things, forming a gate structure around a vertically oriented channel semiconductor structure above a bottom source/drain (S/D) region and below a top source/drain (S/D) region, the gate structure comprising a gate electrode and a gate insulation layer, a first portion of the gate insulation layer being positioned between the gate electrode and the vertically oriented channel semiconductor structure, and removing a second portion and a third portion of the gate insulation layer while leaving at least some of the first portion in position, wherein removal of the second portion defines a top spacer recess between the gate electrode and at least a portion of the top source/drain (S/D) region and removal of the third portion defines a lower spacer recess between the gate electrode and at least a portion of the bottom source/drain (S/D) region. In this example, the method further includes performing a common deposition process to simultaneously form a top spacer in the top spacer recess and a lower spacer in the lower spacer recess.

One illustrative example of a novel vertical transistor device disclosed herein includes, among other things, a vertically oriented channel semiconductor structure, a bottom source/drain (S/D) region, a top source/drain (S/D) region and a gate structure positioned around a vertically oriented channel semiconductor structure above the bottom source/drain (S/D) region and below the top source/drain (S/D) region, wherein the gate structure comprises a gate electrode and a high-k (k value of 10 or greater) gate insulation layer that is positioned between the gate electrode and at least a portion of the vertically oriented channel semiconductor structure. In this example, the device further includes a top spacer positioned between the gate electrode and at least a portion of the top source/drain (S/D) region, a lower spacer positioned between the gate electrode and at least a portion of the bottom source/drain (S/D) region and a gate cap structure positioned around an outer perimeter surface of the gate structure, wherein the top spacer, the lower spacer and the gate cap structure all comprise a same low-k (k value of 7 or less) material.

BRIEF DESCRIPTION OF THE DRAWINGS

The disclosure may be understood by reference to the following description taken in conjunction with the accompanying drawings, in which like reference numerals identify like elements, and in which.

Figure 1:
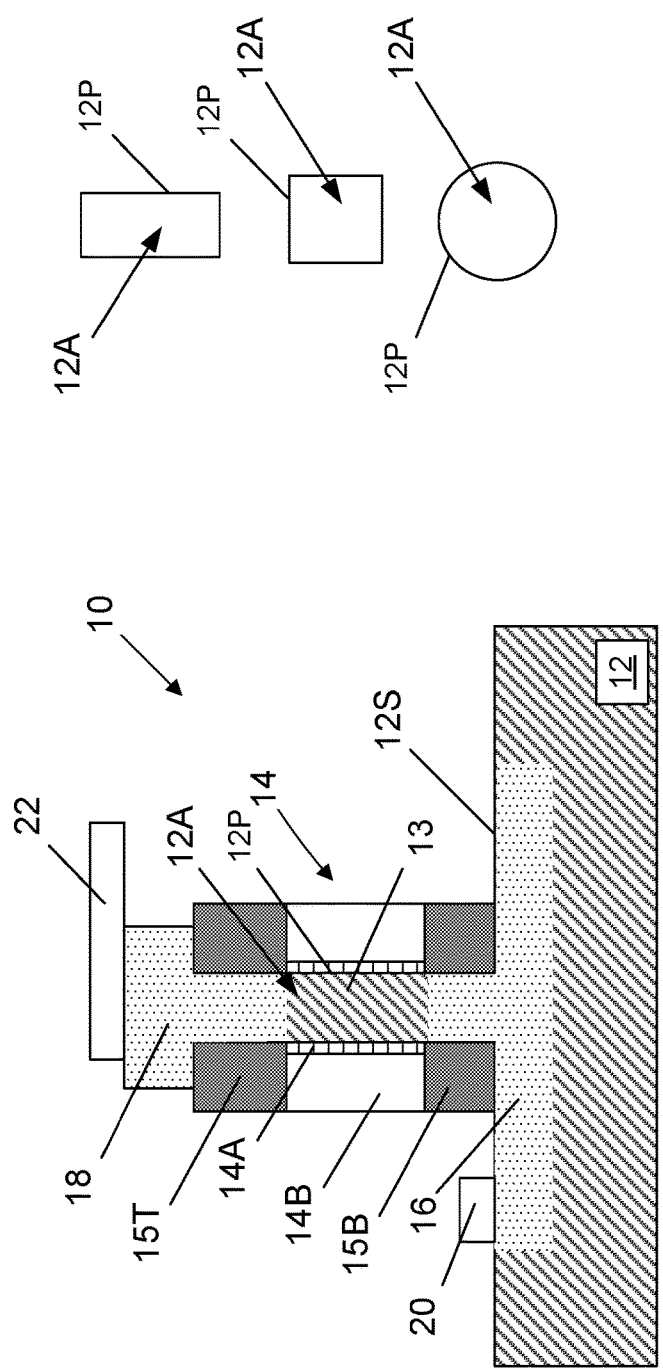
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
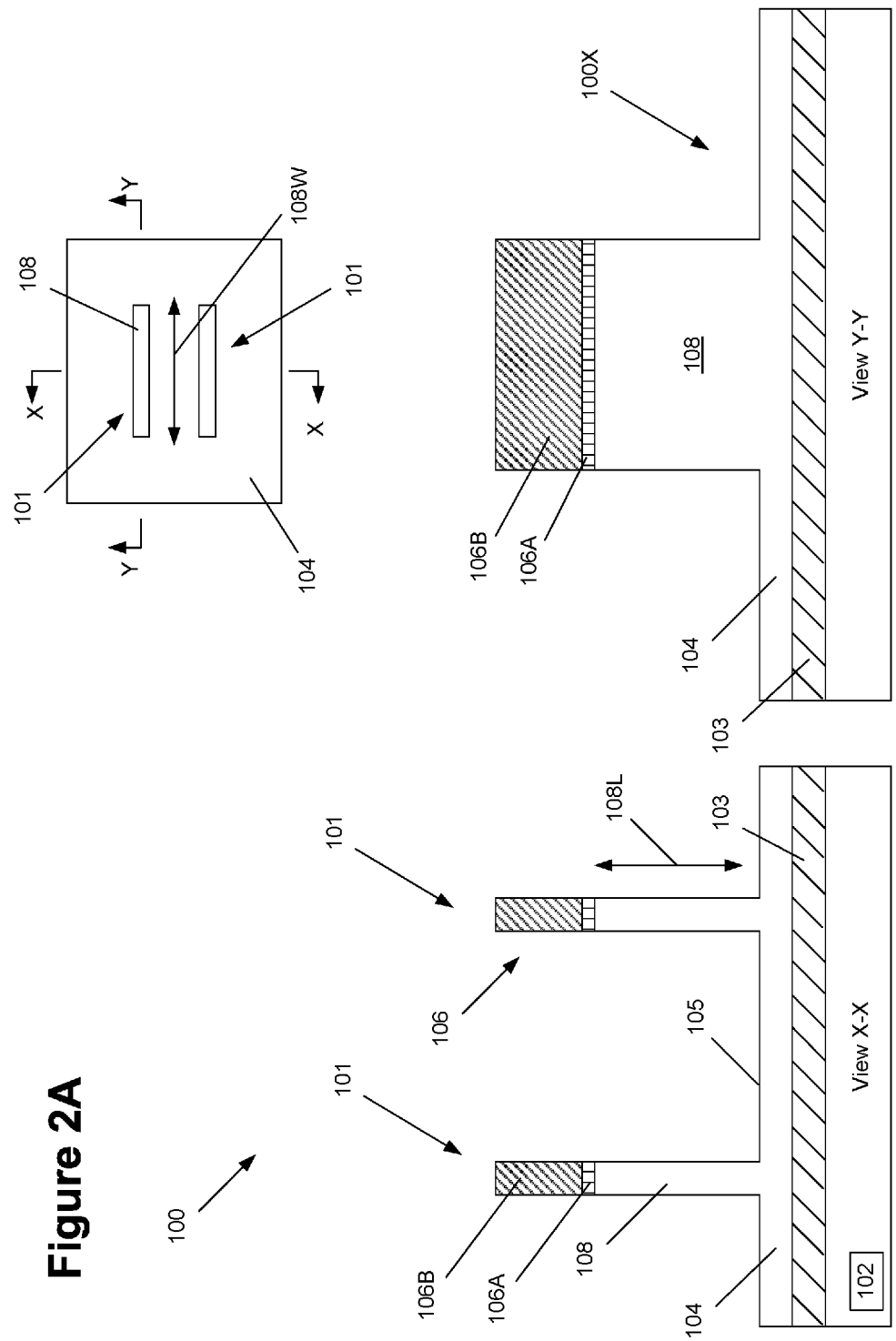
FIGS. 2A-2R depict various illustrative novel methods disclosed herein for simultaneously forming bottom and top spacers on a vertical transistor device and the resulting device.
Figure 2B:
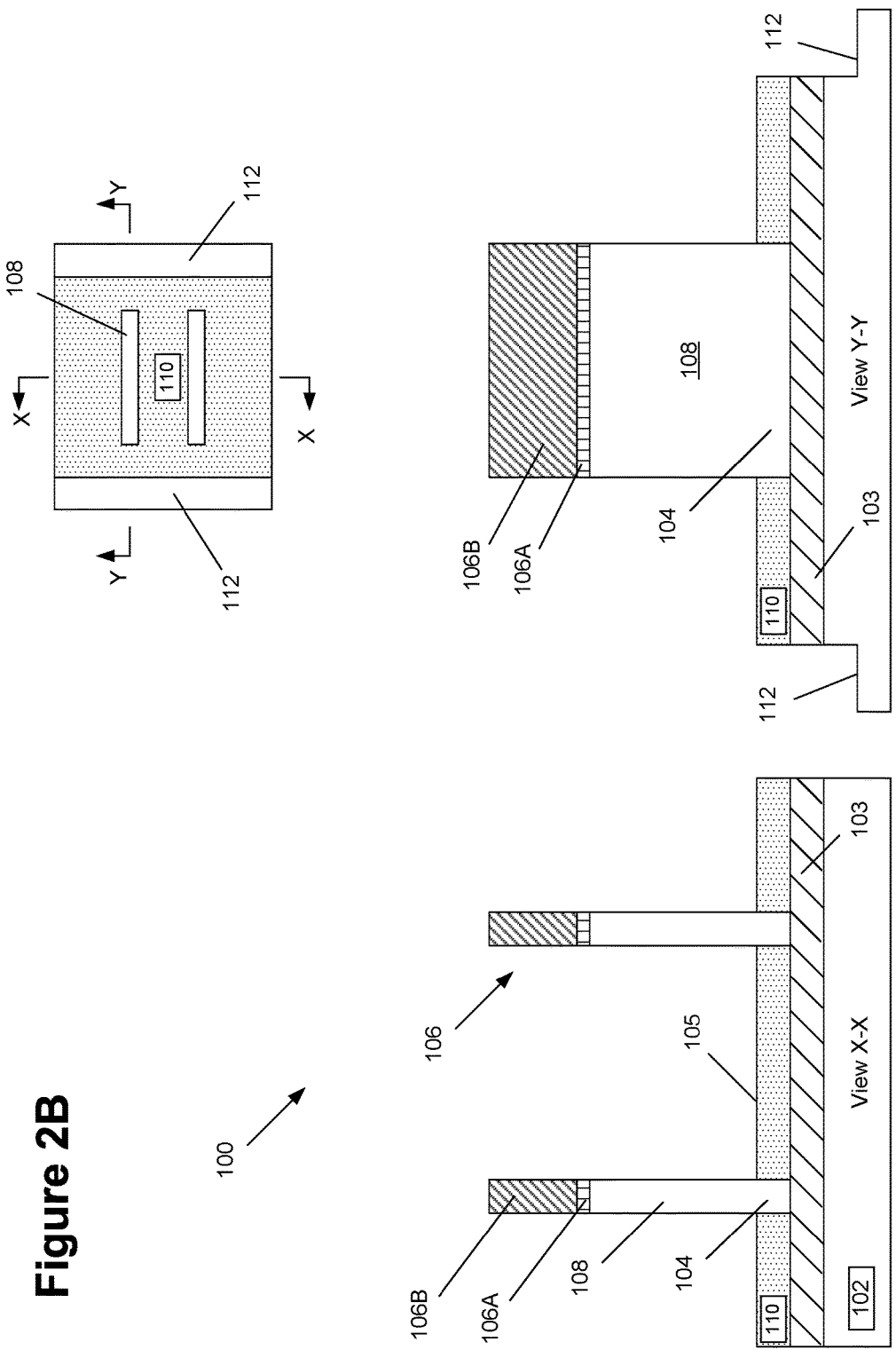
Figure 2C:
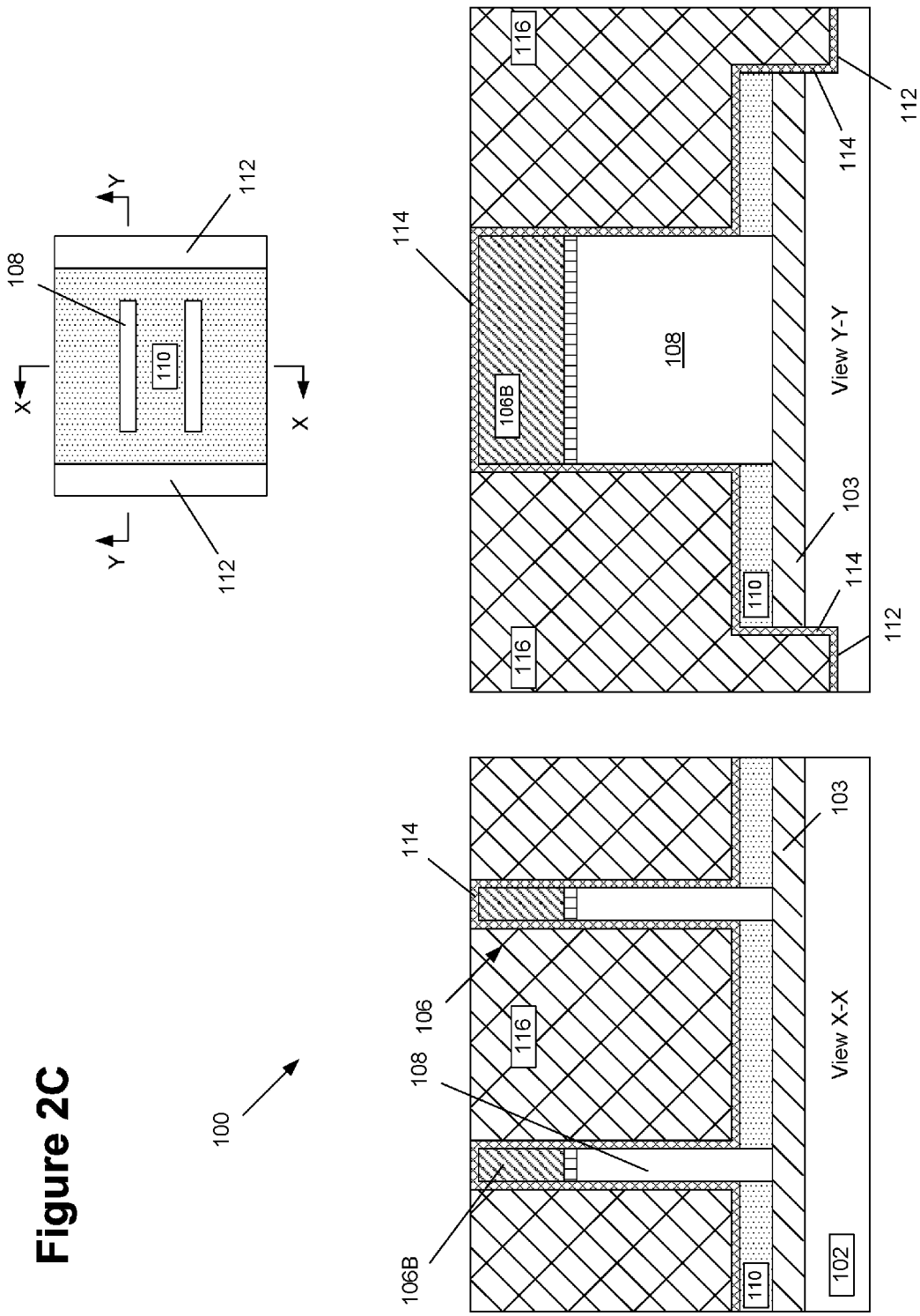
Figure 2D:
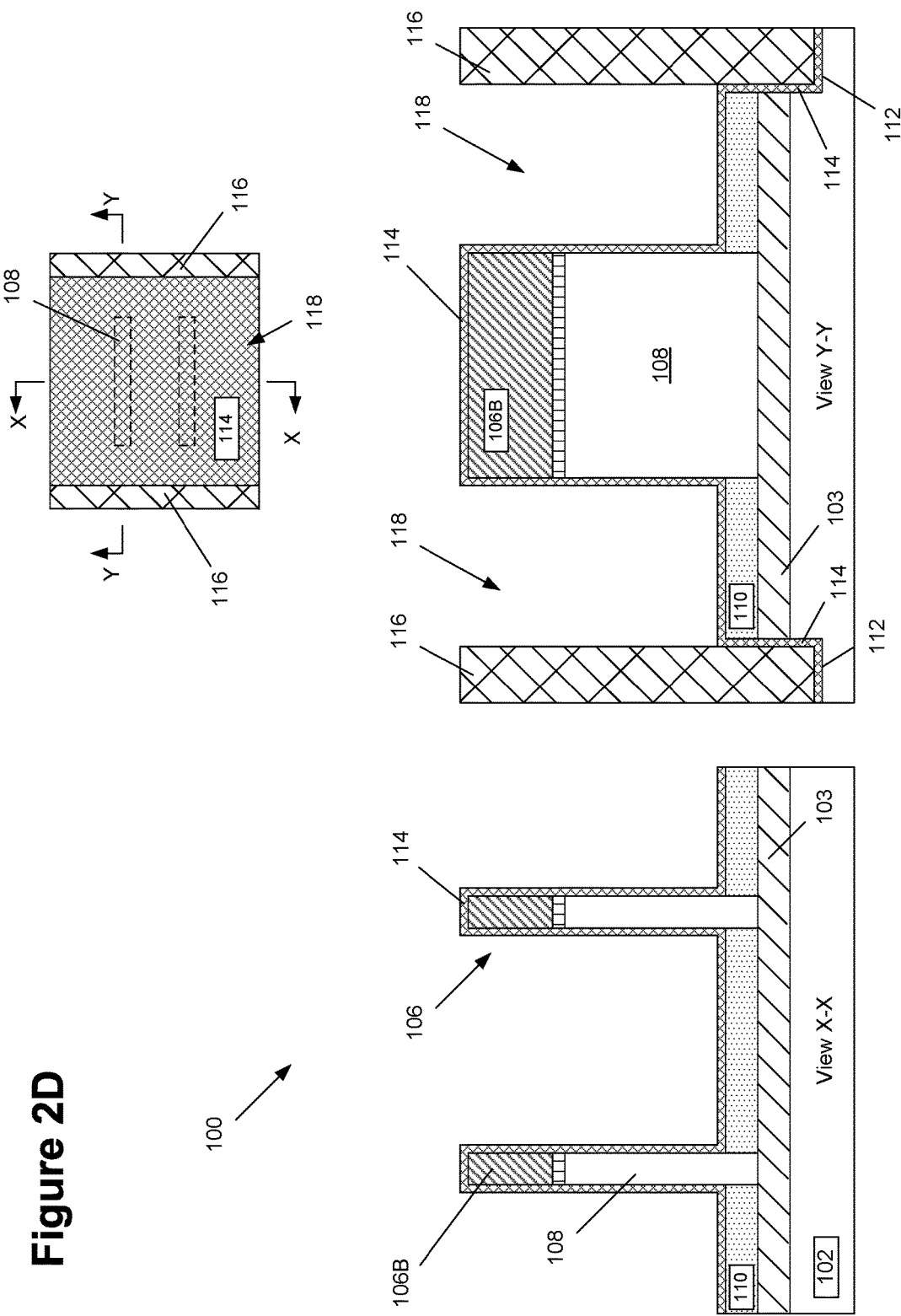
Figure 2E:
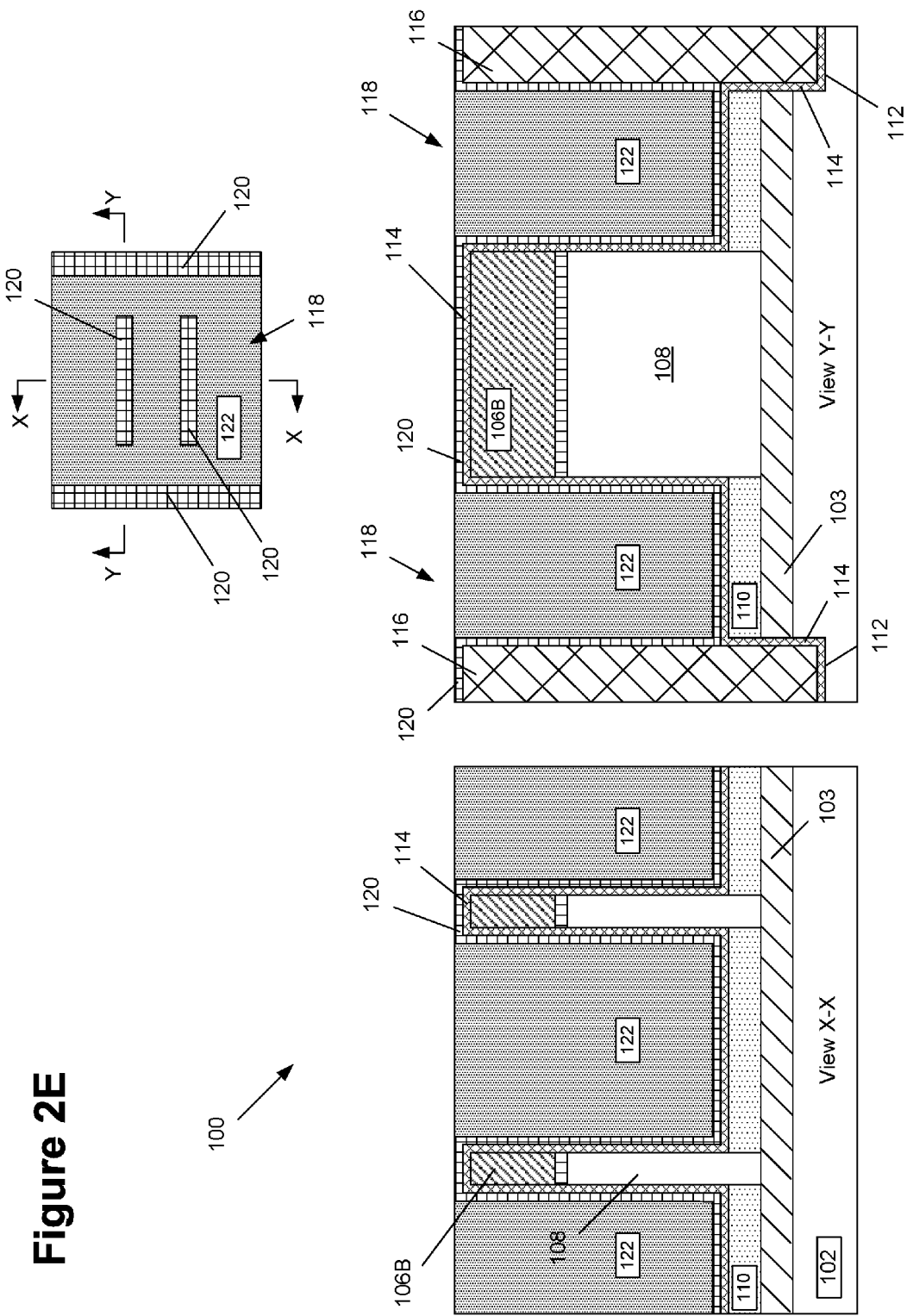
Figure 2F:
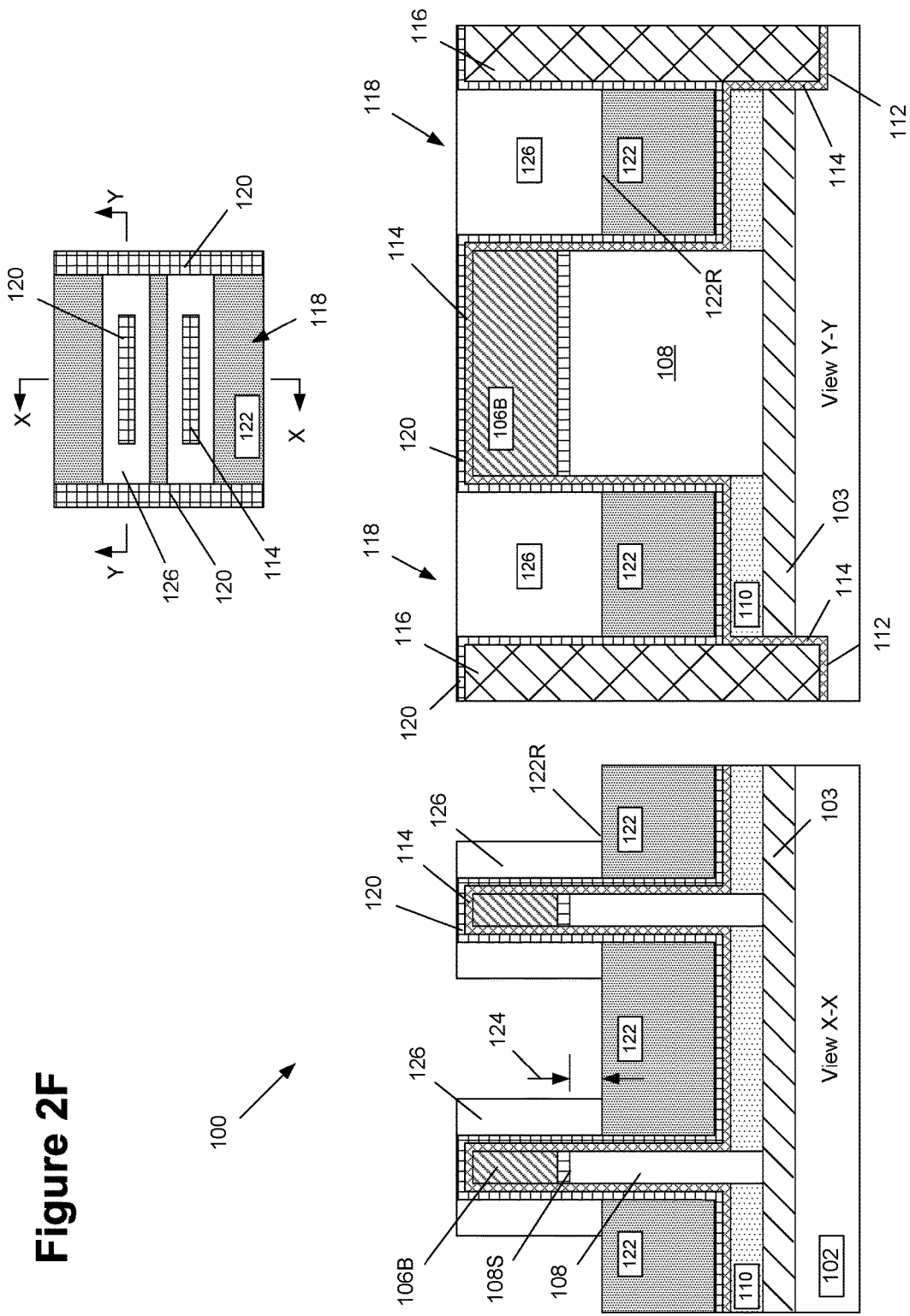
Figure 2G:
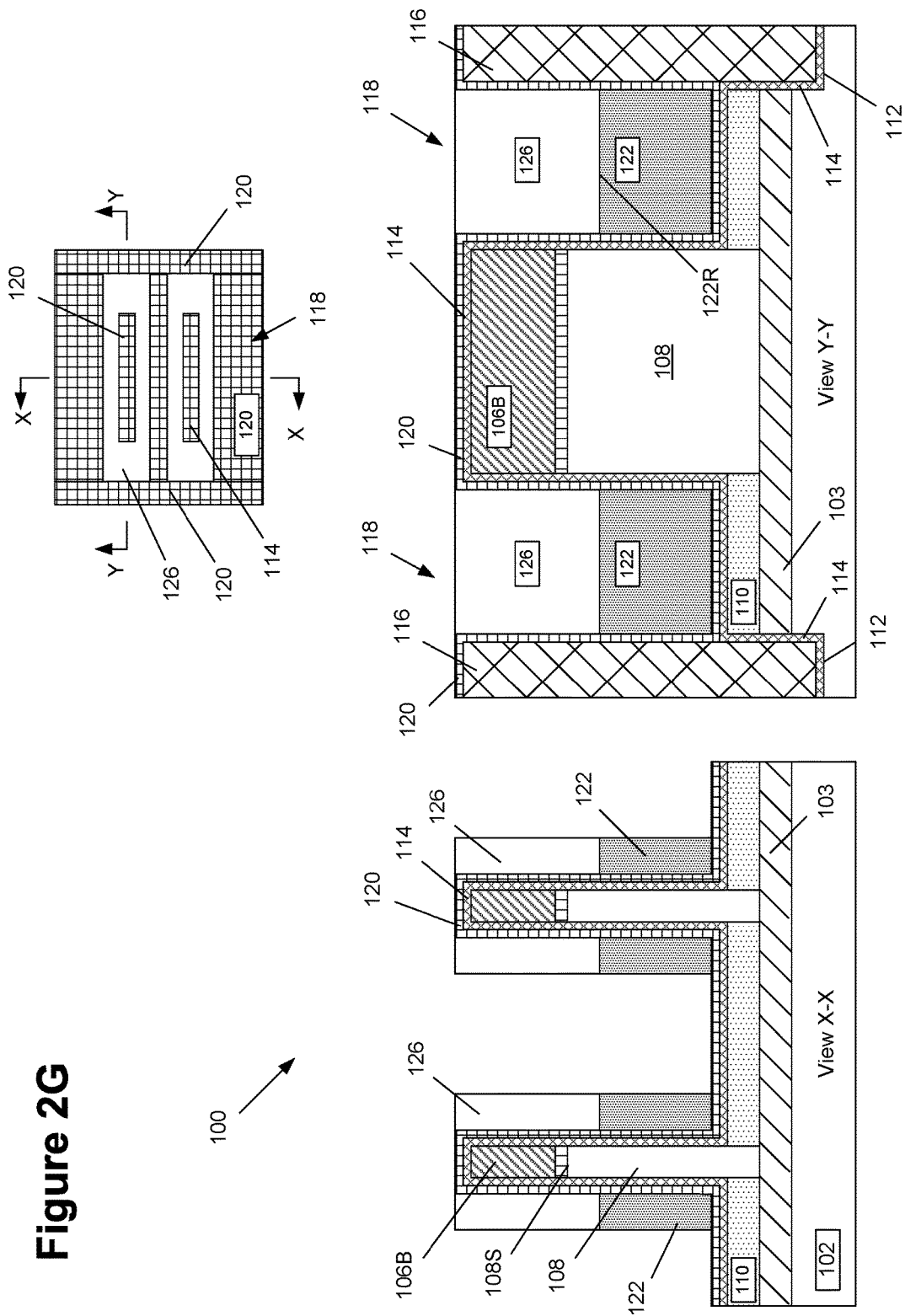
Figure 2H:
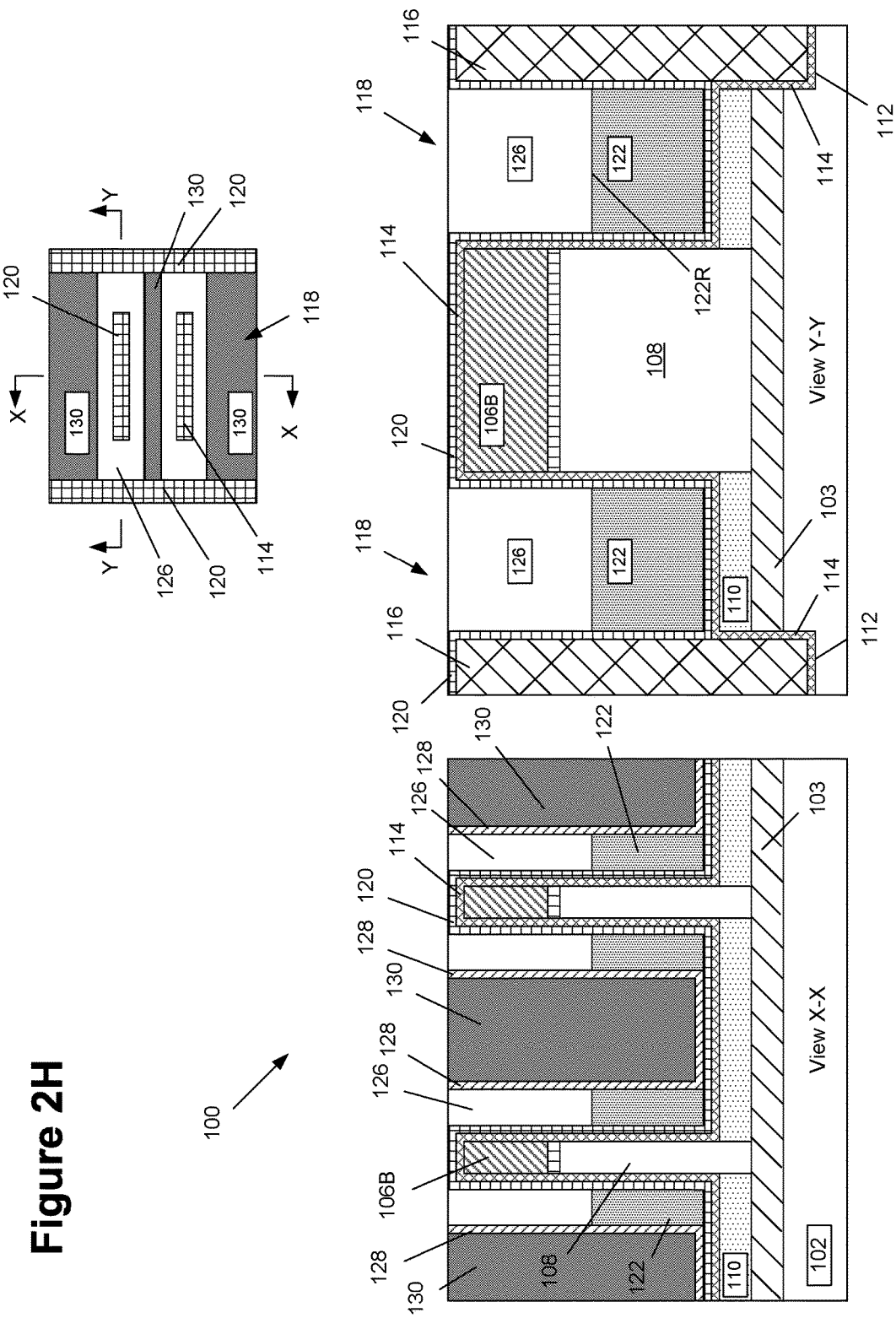
Figure 2I:
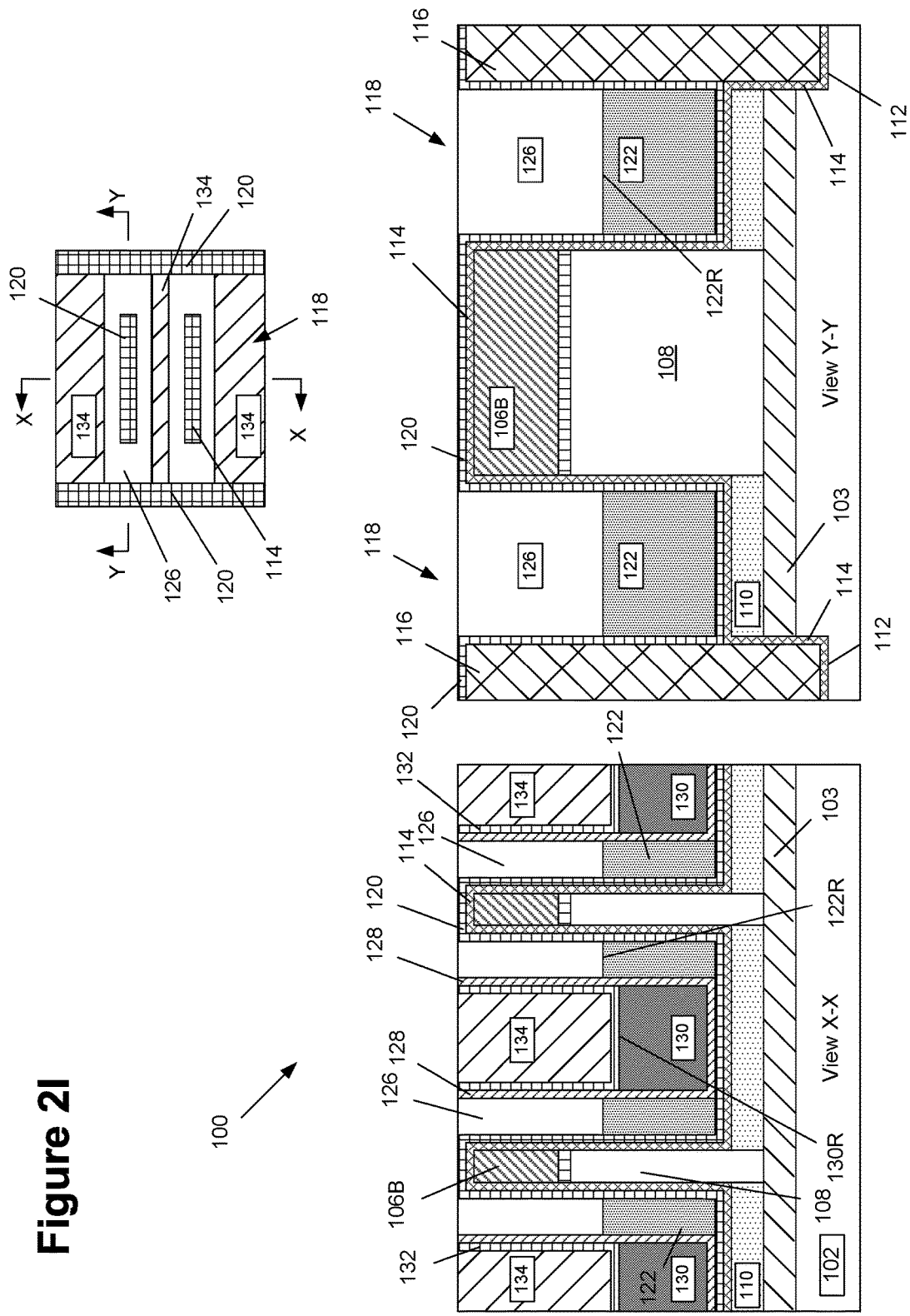
Figure 2J:
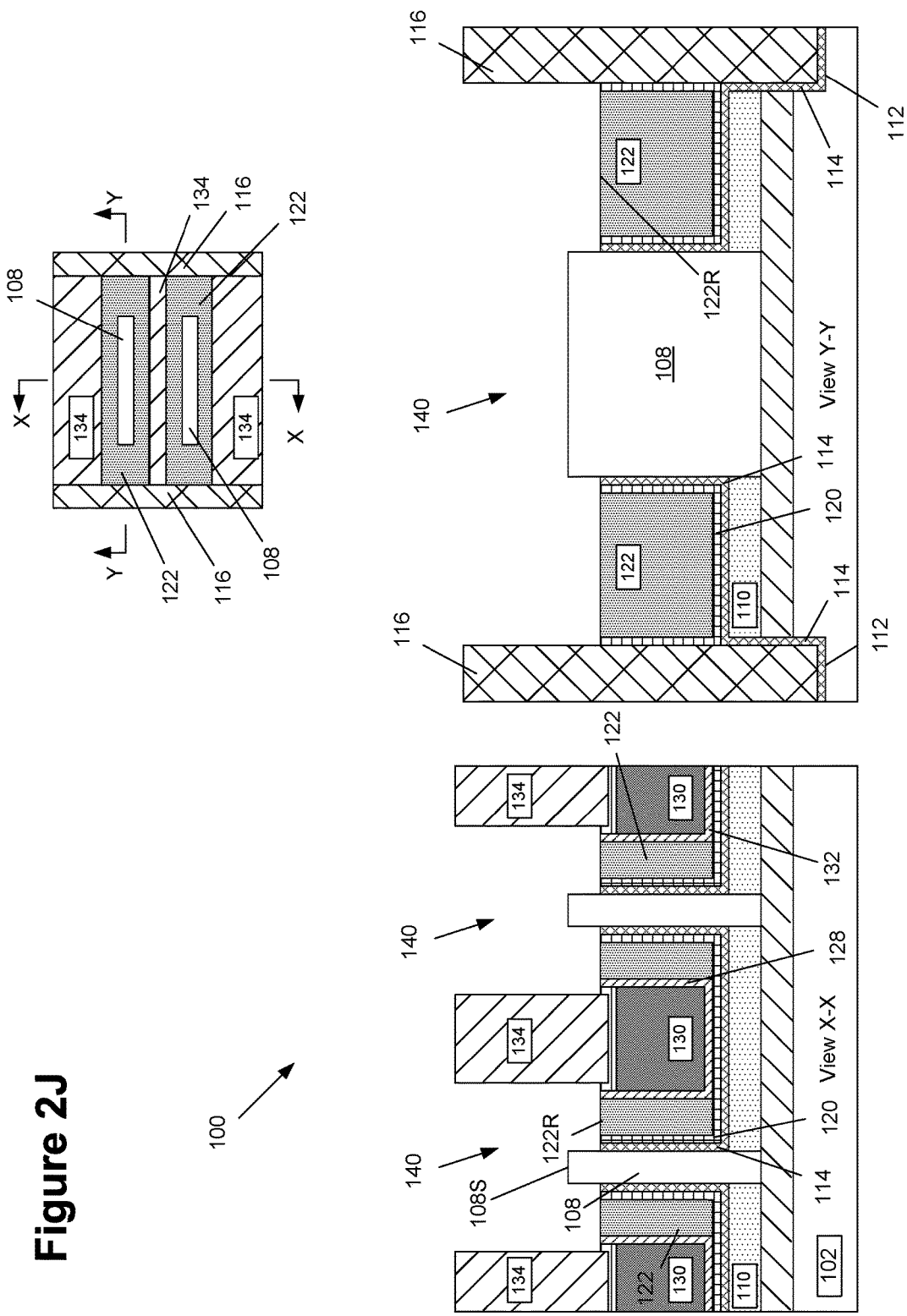
Figure 2K:
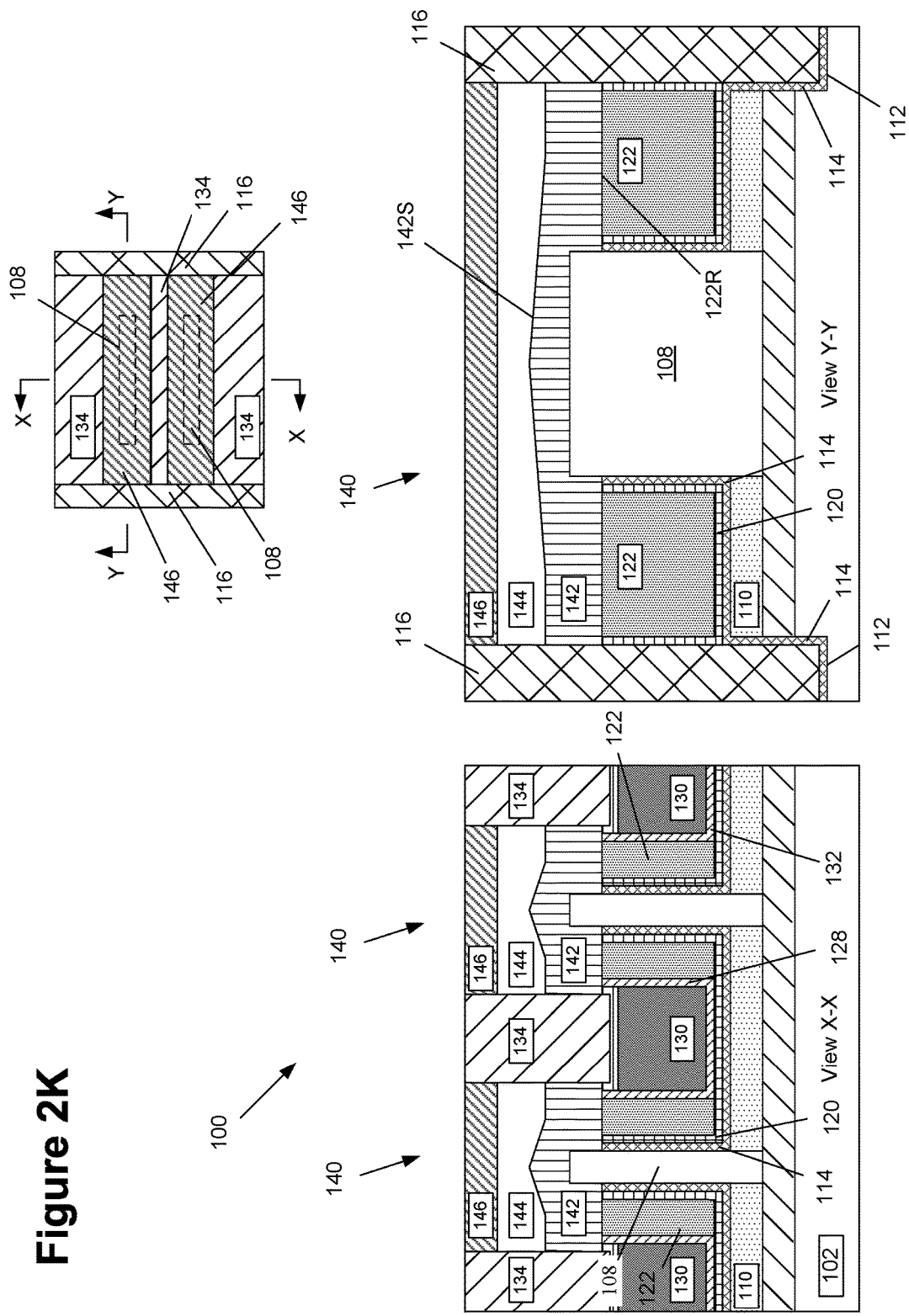
Figure 2L:
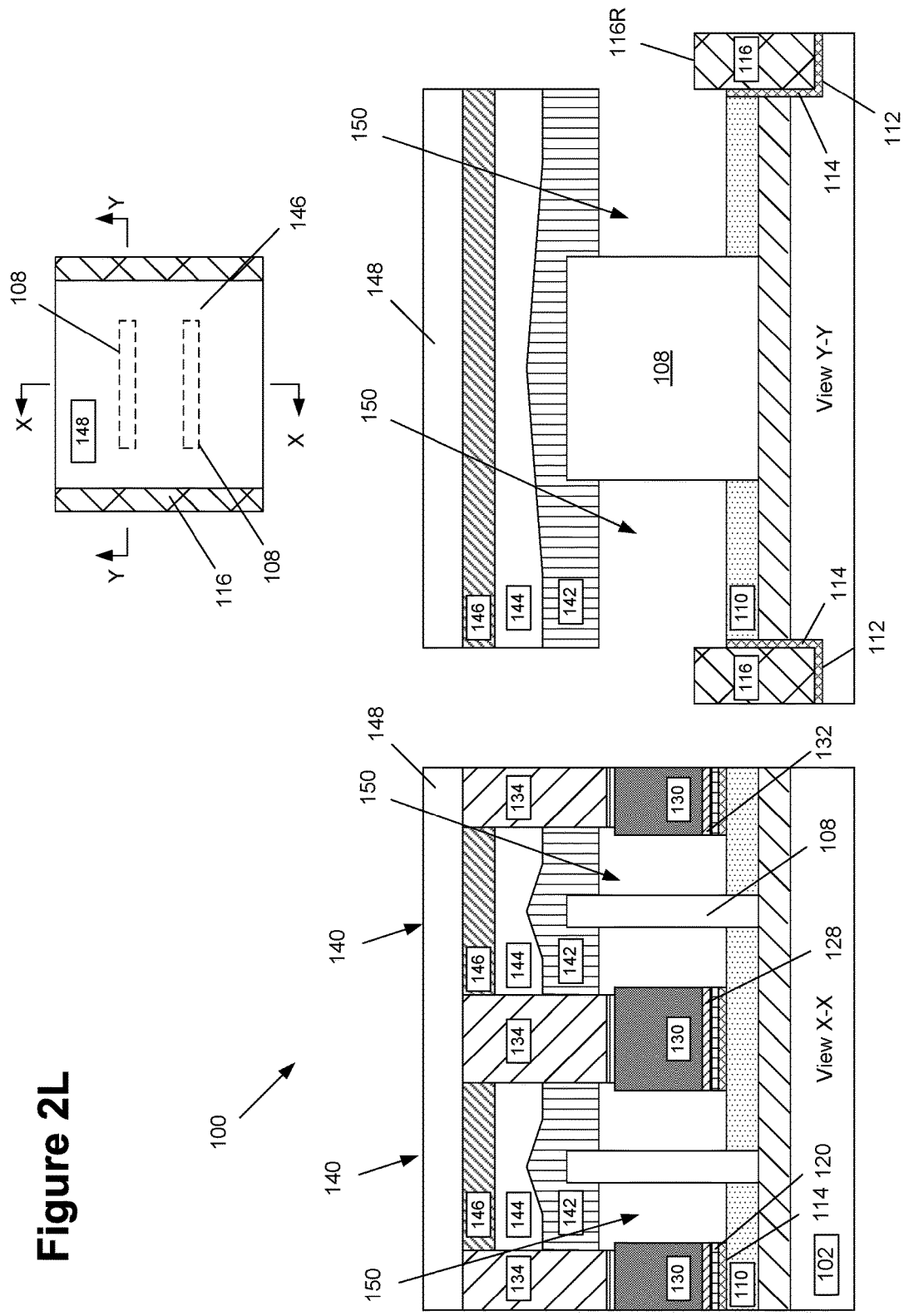
Figure 2M:
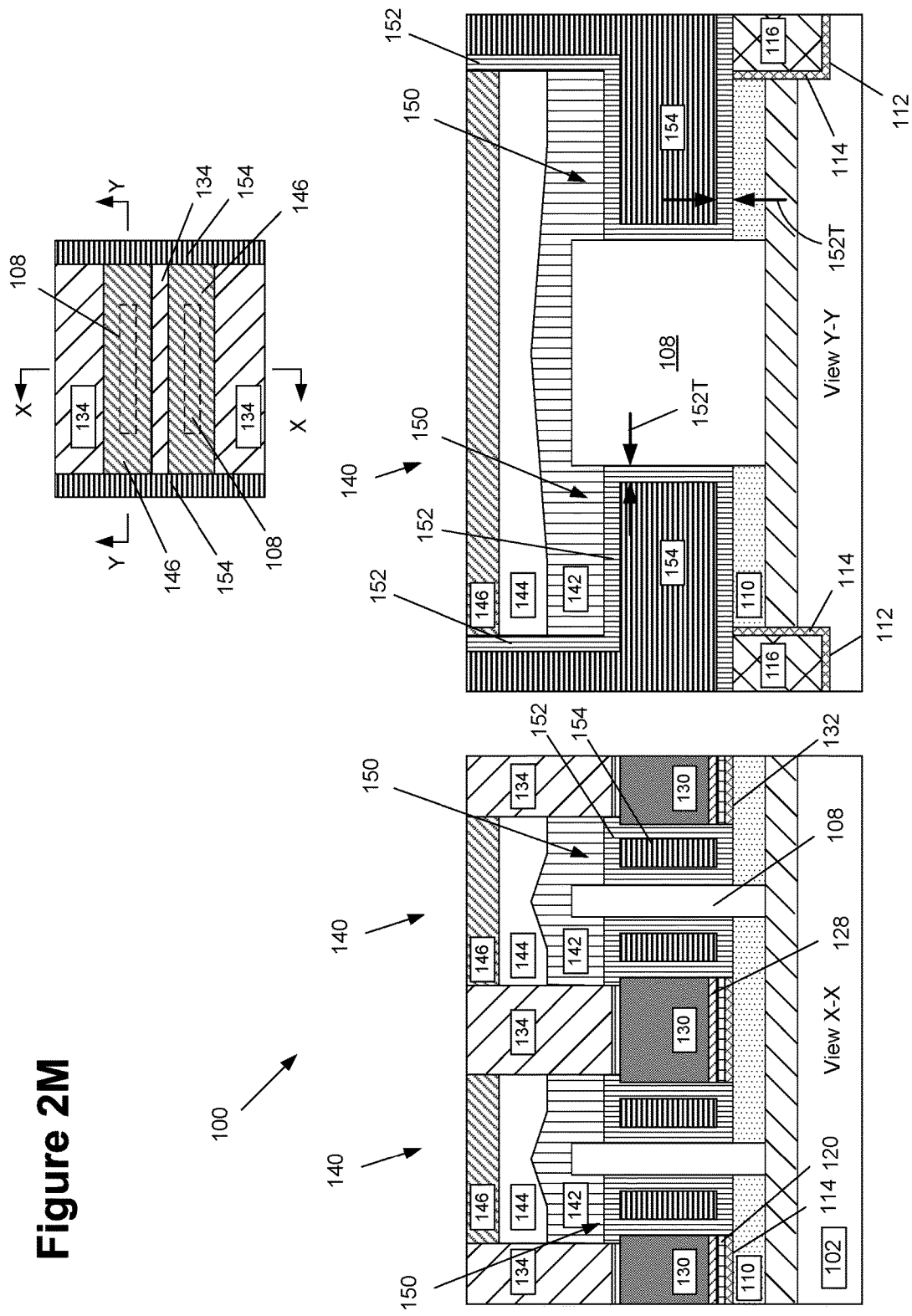
Figure 2N:
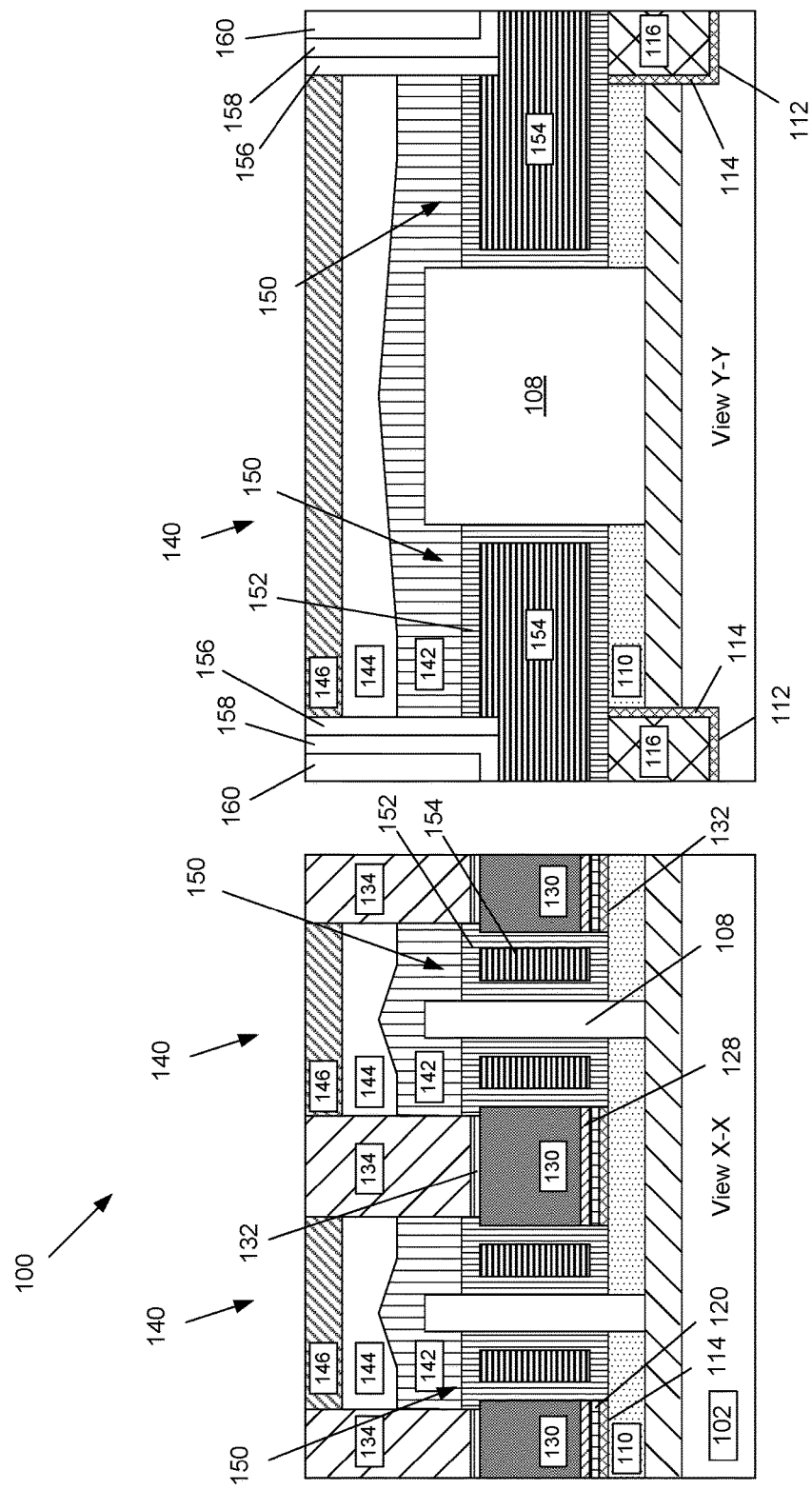
Figure 2O:
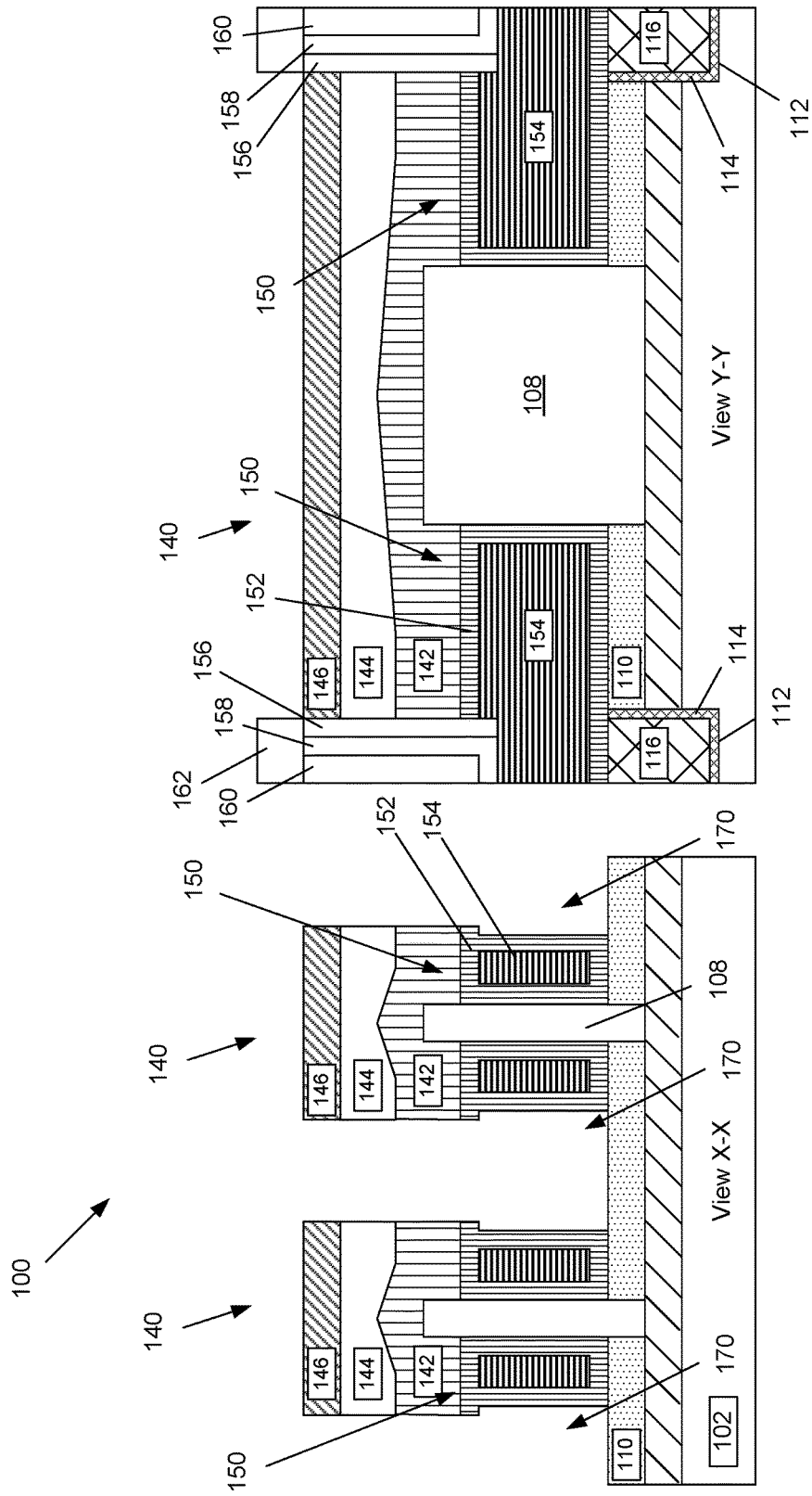
Figure 2P:
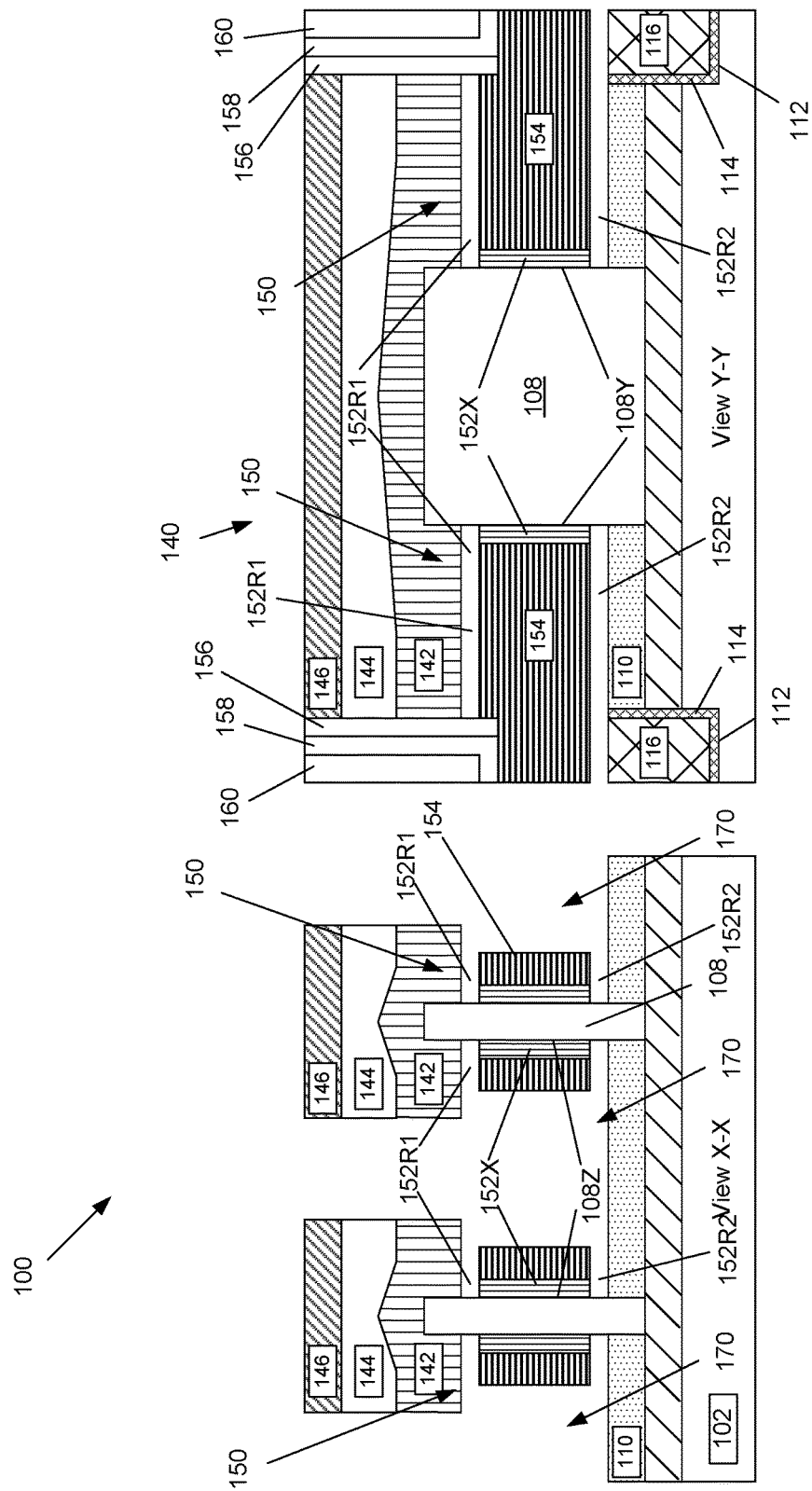
Figure 2Q:
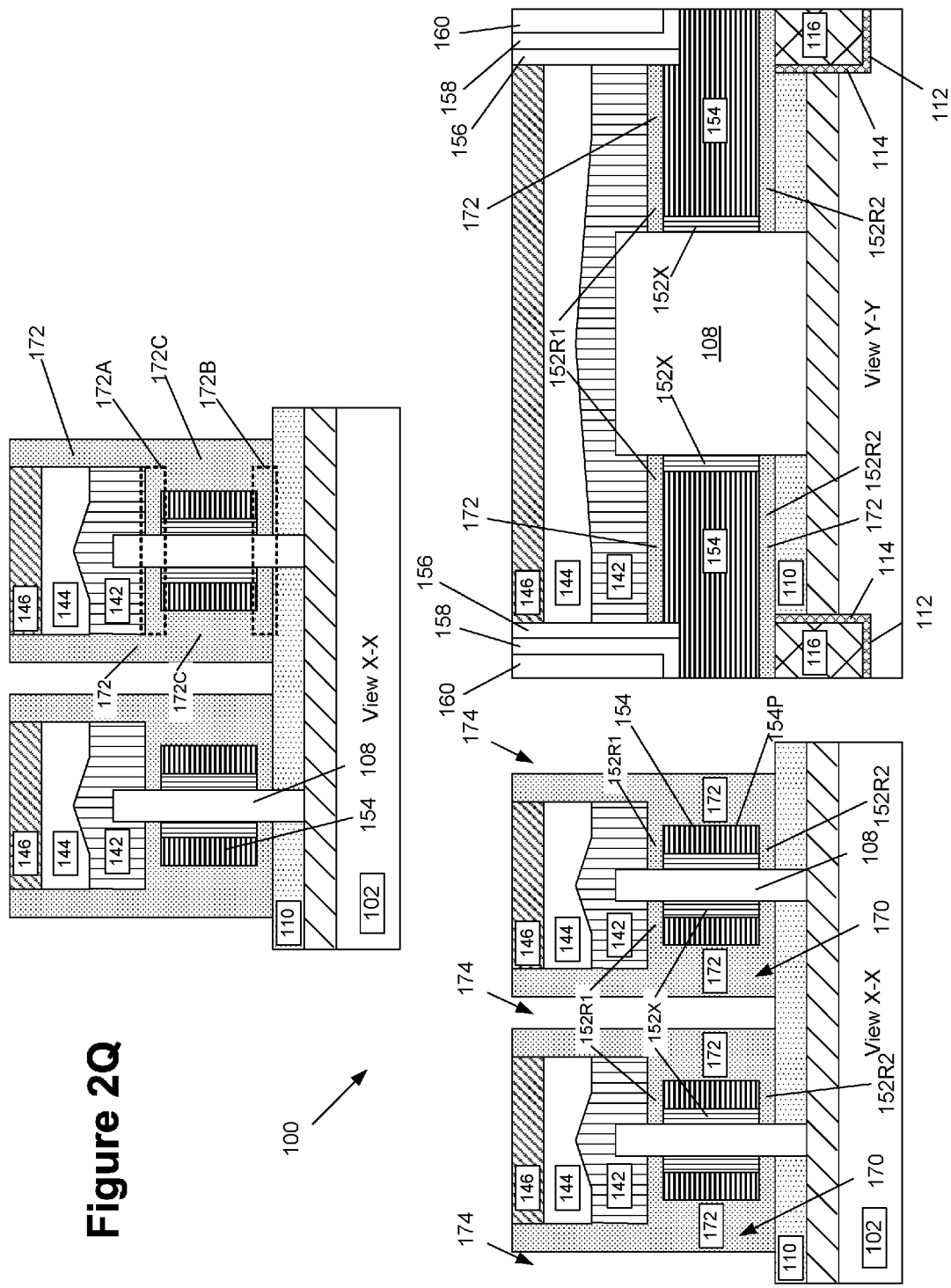
Figure 2R:
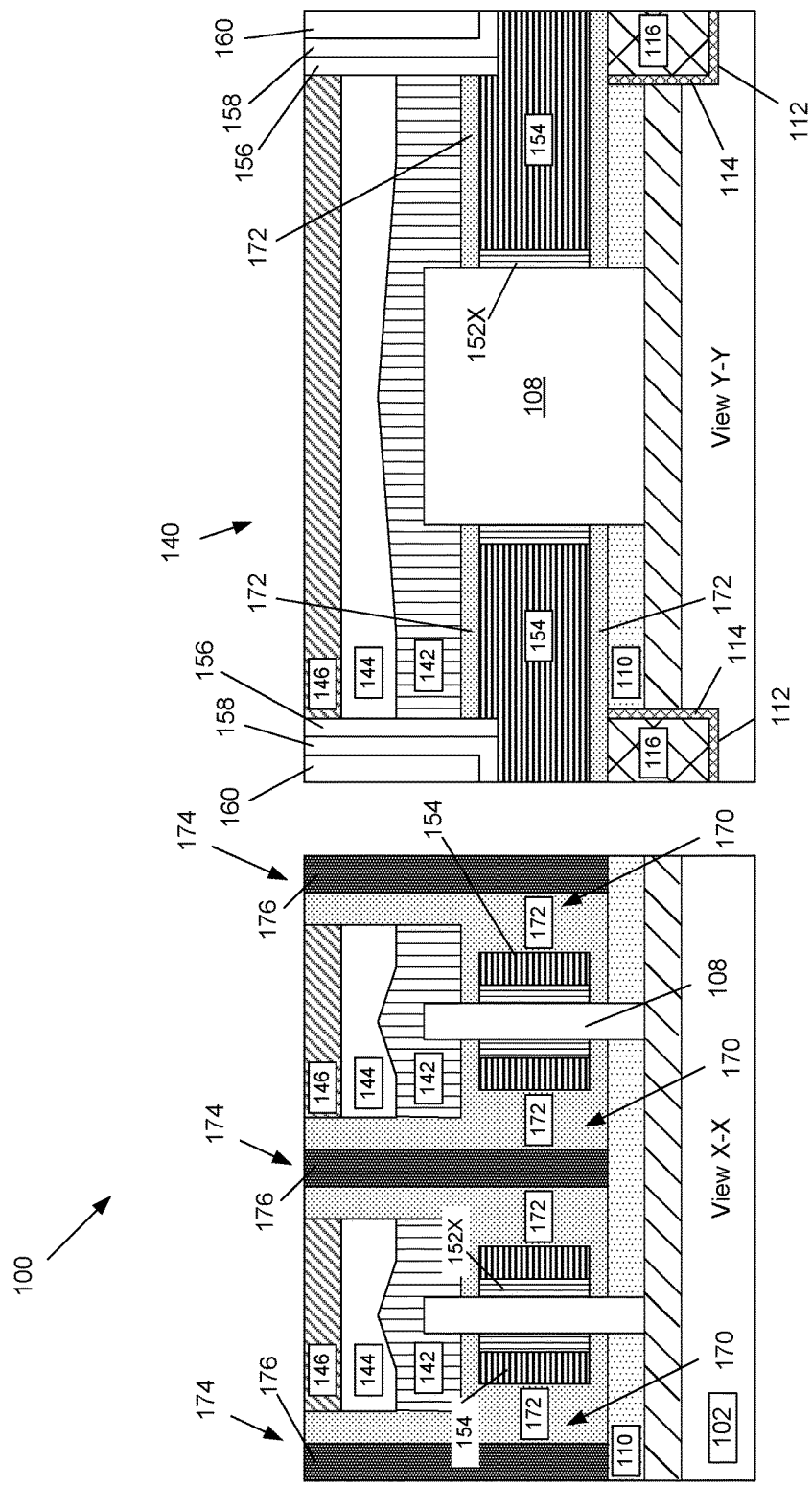

FIGS. 2A-2R depict various illustrative novel methods disclosed herein for simultaneously forming bottom and top spacers on a vertical transistor device of an integrated circuit (IC) product 100 that comprises two illustrative vertical transistor devices 101 each comprised of a vertically oriented channel semiconductor structure 108. Of course, the IC product 100 may typically include millions of such vertical transistor devices 101. During operation, current will flow through the vertically oriented channel semiconductor structure 108 of the vertical transistor device 101 in the direction indicated by the double arrows 108L, which is the gate length direction of the device 101. Several of the drawings also include a simplistic plan view of the IC product 100 (in the upper right corner) that depicts the location where various cross-sectional views depicted in the following drawings will be taken. More specifically, the view "X-X" is a cross-sectional view taken through the vertically oriented channel semiconductor structures 108 of the two illustrative devices 101 in a direction that is normal to the gate length direction 108L of the devices 101. The view Y-Y is a cross-sectional view taken through the vertically oriented channel semiconductor structure 108 of one of the devices in the direction 108W (see plan view) of the vertically oriented channel semiconductor structure 108. Not all aspects of the processing operations reflected in the cross-sectional views will be depicted in the plan views so as not to overly complicate the drawings.

FIG. 2A depicts one illustrative embodiment of the IC product 100 comprised of the two illustrative vertical transistor devices 101 disclosed herein at an early stage of fabrication after several process operations have already been performed. In general, the IC product 100 will be formed in and above a substrate 100X. The substrate 100X may have a variety of configurations, such as a bulk semiconductor (e.g., silicon) configuration. The substrate 100X may, as depicted, also have a semiconductor-on-insulator (SOI) or a silicon-on-insulator configuration that includes a bulk semiconductor layer 102, a buried insulation layer (e.g., silicon dioxide) 103 and an active layer (e.g., silicon) 104, wherein semiconductor devices are formed in and above the active layer 104. The substrate 100X may be made of silicon or it may be made of materials other than silicon. Thus, the terms "substrate" or "semiconductor substrate" should be understood to cover all semiconducting materials and all forms of such materials.

With continuing reference to FIG. 2A, the vertically oriented channel semiconductor structures 108 have been formed for the vertical transistor devices 101. The vertically oriented channel semiconductor structures 108 may be formed using any of a variety of known techniques and it may have a variety of different configurations when viewed from above, e.g., circular, square, rectangular, etc., similar to the top-view configuration of the structure 12A shown in FIG. 1. In the depicted example, the vertically oriented channel semiconductor structures 108 have a substantially rectangular configuration when viewed from above. The physical dimensions (e.g., height, width and thickness) of the vertically oriented channel semiconductor structures 108 may vary depending upon the particular application. In the depicted example, the vertically oriented channel semiconductor structures 108 were formed by performing one or more etching processes through a patterned etch mask 106 so as to define a plurality of trenches 105 in the active layer 104 of the substrate 100X. The patterned etch mask 106 may be comprised of one or more layers of material and it may be formed by performing one or more layers of material and thereafter patterning those materials using known photolithography and etching techniques. In one illustrative embodiment, the patterned etch mask 106 may be comprised of a layer of silicon dioxide 106A and a layer of silicon nitride 106B.

Next, as shown in FIG. 2B, in one illustrative embodiment, an ion implantation process was performed to form a bottom source/drain (S/D) region or structure 110 for the devices 101 in the active layer 104. The bottom source/drain (S/D) region 110 may be doped with an appropriate dopant (N-type or P-type depending upon the type of device 101 under construction). In some applications, and other process flows, the bottom source/drain (S/D) region 110 may be made of the same semiconductor material as that of the bulk substrate 102, or it may be made of a semiconductor material that is different than that of the bulk substrate 102. Then, an isolation trench 112 that extends into the bulk substrate 102 was defined by performing an etching process through a patterned etch mask (not shown), e.g., a patterned layer of photoresist material. The patterned etch mask was then removed.

FIG. 2C depicts the IC product 100 after several process operations were performed. First, a relatively thin liner layer 114 was formed above the IC product 100 by performing a conformal deposition process, e.g., ALD, CVD. In one illustrative embodiment, the liner layer 114 may be comprised of a material such as silicon nitride, silicon oxynitride, etc. The thickness of the liner layer 114 may vary depending upon the particular application, e.g., 2-4 nm. Then, a layer of insulating material 116, e.g., silicon dioxide, was blanket-deposited across the IC product 100 and above the liner layer 114. Thereafter, a planarization process, such as a CMP (Chemical Mechanical Planarization) process was performed on the layer of insulating material 116 that stops on the upper surface of the liner layer 114.

FIG. 2D depicts the IC product 100 after an etching process was performed on the layer of insulating material 116 through a patterned etch mask (not shown), e.g., a patterned layer of photoresist material, so as to remove exposed portions of the layer of insulating material 116. The patterned etch mask was then removed. This process operation results in the formation of a cavity 118 in the layer of insulating material 116 around the vertically oriented channel semiconductor structures 108 and exposes additional portions of the liner layer 114.

FIG. 2E depicts the IC product 100 after several process operations were performed. First, another relatively thin liner layer 120 was formed above the IC product 100 by performing a conformal deposition process, e.g., ALD, CVD. In one illustrative embodiment, the liner layer 120 may be comprised of a material such as silicon nitride, silicon oxynitride, etc. In some applications, the liner layer 120 may be comprised of the same material as that of the liner layer 114, but that may not be the case in other applications. The thickness of the liner layer 120 may vary depending upon the particular application, e.g., 2-4 nm. Then, a layer of sacrificial material 122, e.g., a flowable oxide, was blanket-deposited across the IC product 100 and above the liner layer 120 so as to over-fill the cavity 118. Thereafter, a planarization process, such as a CMP process, was performed on the layer of sacrificial material 122 that stops on the upper surface of the liner layer 120. As will be described more fully below, the layer of sacrificial material 122 is a layer of sacrificial gate material that will be subsequently removed so that a replacement gate structure can be formed in its place.

FIG. 2F depicts the IC product 100 after several process operations were performed. First, a recess etching process was performed on the layer of sacrificial material 122 such that it has a recessed upper surface 122R that is positioned at a level that is below the level of the upper surface 108S of the vertically oriented channel semiconductor structures 108 by a distance 124. In some applications, the distance 124 may be on the order of about 3-10 nm. Next, a spacer 126 was formed in the cavity 118 adjacent the vertically oriented channel semiconductor structures 108 by performing a conformal deposition process to form a conformal layer of spacer material (e.g., SiN) in the opening 118 above the recessed layer of sacrificial material 122 and thereafter performing an anisotropic etching process. The spacer 126 may be formed to any desired lateral thickness.

FIG. 2G depicts the IC product 100 after an anisotropic (ME) etching process was performed on the exposed portions of the layer of sacrificial material 122 not protected by the spacer 126. This etching process stops on the liner layer 120. The remaining portions of the layer of sacrificial material 122 constitute a sacrificial gate structure.

FIG. 2H depicts the IC product 100 after several process operations were performed. First, another relatively thin liner layer 128 was formed above the IC product 100 by performing a conformal deposition process, e.g., ALD, CVD. In one illustrative embodiment, the liner layer 128 may be comprised of a material such as silicon nitride, silicon oxynitride, etc. In some applications, the liner layer 128 may be comprised of the same material as that of the liner layers 120 and/or 114, but that may not be the case in other applications. The thickness of the liner layer 128 may vary depending upon the particular application, e.g., 2-4 nm. Then, another layer of sacrificial material 130, e.g., polysilicon, amorphous silicon, was blanket-deposited across the IC product 100 and above the liner layer 128 so as to over-fill the remaining un-filled portions of the cavity 118. Thereafter, a planarization process, such as a CMP process, was performed on the layer of sacrificial material 130 that stops on the upper surface of the liner layer 120.

FIG. 2I depicts the IC product 100 after several process operations were performed. First, a recess etching process was performed on the layer of sacrificial material 130 such that it has recessed upper surface 130R that is positioned at a level that is below the level of the recessed upper surface 122R of the layer of sacrificial material 122 (i.e., the sacrificial gate structure) by a distance that, in some applications, may be on the order of about 3-10 nm. Next, another relatively thin liner layer 132 was formed above the IC product 100 by performing a conformal deposition process, e.g., ALD, CVD. In one illustrative embodiment, the liner layer 132 may be comprised of a material such as silicon nitride, silicon oxynitride, etc. In some applications, the liner layer 132 may be comprised of the same material as that of the liner layers 128, 120 and/or 114, but that may not be the case in other applications. The thickness of the liner layer 132 may vary depending upon the particular application, e.g., 2-4 nm. Then, a layer of insulating material 134, e.g., an HDP oxide, was blanket-deposited across the IC product 100 and above the liner layer 132 so as to over-fill the remaining un-filled portions of the cavity 118. Thereafter, a planarization process, such as a CMP process, was performed on the layer of insulating material 134 that stops on the upper surface of the liner layer 120. Note, no attempt has been made to show the liner layer 132 in the simplistic plan view.

FIG. 2J depicts the IC product 100 after one or more etching processes were performed to remove the mask layer 106, the spacer 126 and portions of the liner layers 114, 120, 128 and 132 selectively relative to the surrounding materials and structures. These operations result in the formation of a cavity 140, the exposure of the upper surface 108S and an upper portion of the vertically oriented channel semiconductor structures 108 and the exposure of the recessed upper surface 122R of the layer of sacrificial material 122.

FIG. 2K depicts the IC product 100 after several process operations were performed. First, an epitaxial growth process was performed to form a top source/drain (S/D) region or structure 142 in the cavity 140 and on and around the exposed portions of the vertically oriented channel semiconductor structures 108 and on the recessed upper surface 122R of the layer of sacrificial material 122. The top source/drain (S/D) region 142 may be comprised of different materials depending upon the type of device under construction, e.g., SiGe for a P-type device, SiC for an N-type device. In the depicted example, the top source/drain (S/D) region 142 has a simplistically depicted faceted upper surface 142S, although it may be substantially planar in other applications. The top source/drain (S/D) region 142 may be in situ doped with an appropriate dopant (N-type or P-type depending upon the type of device under construction) during the formation of the top source/drain (S/D) region 142. It should be noted that, since the final gate materials for the devices 101 have not yet been formed, the top source/drain (S/D) region 142 can be formed using relatively higher temperature processes, thereby resulting in a higher quality top source/drain (S/D) region 142 without adversely impacting the final gate materials for the devices 101. Next, a simplistically depicted conductive top source/drain contact structure 144 is formed within the cavity 140 on the top source/drain (S/D) region 142. The conductive top source/drain contact structure 144 may be comprised of any conductive material, e.g., a metal, such as tungsten, a metal alloy, etc. The conductive top source/drain contact structure 144 may be formed by over-filling the remaining portions of the cavity 140 and thereafter performing a recess etching process on the conductive material to define the final thickness of the conductive top source/drain contact structure 144. Thereafter, a top source/drain (S/D) cap 146 is formed in the remaining portions of the cavity 140 on the conductive top source/drain contact structure 144. The top source/drain (S/D) cap 146 may be comprised of a variety of insulating materials, e.g., a low-k material (k value less than 7), such as, for example, $Si_3N_4$, SiBCN, SiOCN, etc. The top source/drain (S/D) cap 146 may be formed by over-filling the remaining portions of the cavity 140 and thereafter performing a CMP process that stops on the layers of insulating material 116, 134.

FIG. 2L depicts the IC product 100 after several process operations were performed. First, a block masking layer 148, e.g., a patterned layer of photoresist, was formed so as to cover the insulating material 134 while leaving the insulating material 116 exposed. Then, a recess etching process was performed on the layer of insulating material 116 such that it has a recessed upper surface 116R that exposes the liner layer 120 positioned around the layer of sacrificial material 122 (see FIG. 2K). In one illustrative example, the distance between the recessed upper surface 122R of the layer of sacrificial material 122 and the recessed surface 116R of the layer of insulating material 116 may be on the order of about 20-30 nm. Next, one or more etching processes were performed to remove portions of the liner layers 114, 120, 128 and 132 selectively relative to the surrounding materials and structures and to remove the remaining portions of the layer of sacrificial material 122 (i.e., the sacrificial gate structure). The removed materials are accessible to being removed by etching due to the recessing of the layer of insulating material 116. These operations result in the formation of a replacement gate cavity 150 and the exposure of the perimeter surfaces of the vertically oriented channel semiconductor structures 108 between the bottom S/D structure 110 and the top S/D structure 142 as well as the upper surface of the bottom S/D structure 110 and the bottom surface of the top S/D structure 142. The mask layer 148 may be removed before, after or as part of the etching processes that are performed to remove the materials to define the gate cavity 150.

At this point, the process is directed to forming materials for the final gate structures for the vertical transistor devices 101 in the gate cavities 150 around the outer perimeter surface of the vertically oriented channel structures 108 and for the later gate contact formation above the STI region. Accordingly, FIG. 2M depicts the IC product 100 after several process operations were performed. In general, the final gate structure may be comprised of at least one layer of high-k (k value of 10 or greater) layer of insulating material, such as hafnium oxide, that functions (in whole or part) as the gate insulation layer 152 for the devices 101, and one or more layers of conductive material, e.g., a metal, a metal alloy, polysilicon, a work-function adjusting metal (e.g., titanium nitride), etc., that functions (in whole or part) as the gate electrode 154 of the device 100. The thickness and composition of the material(s) for the gate insulation layer 152 and the gate electrode 154 may vary depending upon the particular application, and the relative thickness of the materials for the gate structure shown in the drawings is not to scale. In one illustrative embodiment, the layer of insulating material 152 may have a thickness 152T on the order of about 4-12 nm. As will be appreciated by those skilled in the art after a complete reading of the present application, the gate structures are intended to be representative of any type of gate structure that may be formed using any techniques. In one illustrative example, the gate insulation layer 152 and the material(s) may be formed by performing one or more conformal deposition processes to form the gate insulation layer 152 in the gate cavity 150 on the exposed surfaces of the vertically oriented channel semiconductor structures 108, the upper surface of the bottom S/D structure 110 and the bottom surface of the top S/D structure 142.

Thereafter, the material(s) for the gate electrode 154 may be formed within the gate cavity 150 on the gate insulation layer 152 by performing one or more deposition processes, perhaps including one or more conformal deposition processes. Note, no attempt has been made to show the gate insulation layer 152 in the simplistic plan view.

FIG. 2N depicts the IC product 100 after several process operations were performed. First, one or more recess etching processes were performed to recess the material(s) of the gate insulation layer 152 and the gate electrode 154 that were that were positioned laterally adjacent the top source/drain (S/D) cap 146, the conductive top source/drain contact structure 144 and the top source/drain (S/D) region 142, as shown in the view Y-Y. Then, a spacer 156 comprised of a low-k material was formed above the recessed materials 152/154. The spacer 156 was formed by performing a conformal deposition process to form a conformal layer of spacer material (e.g., SiN) above the recessed materials 152/154 and thereafter performing an anisotropic etching process. The spacer 156 may be formed to any desired lateral thickness. Next, another relatively thin liner layer 158 was formed above the recessed materials 152/154 adjacent the spacer 156 by performing a conformal deposition process, e.g., ALD, CVD. In one illustrative embodiment, the liner layer 158 may be comprised of a material such as silicon nitride, silicon oxynitride, etc. Thereafter, a layer of insulating material 160, e.g., an HDP oxide, was blanket-deposited across the IC product 100 and above the remaining space above the recessed materials 152/154 adjacent the liner layer 158. Finally, a planarization process, such as a CMP process, was performed on the layer of insulating material 160 that stops on the upper surface of the top source/drain (S/D) cap 146.

FIG. 2O depicts the IC product 100 after several process operations were performed. First, a patterned masking layer 162, e.g., a patterned layer of photoresist, was formed so as to cover the insulating material 160 while leaving the insulating material 134 exposed (see FIG. 2N). Then, one or more etching processes were performed (perhaps sequentially) to remove the insulating material 134, the liner layer 132, the sacrificial material layer 130 and portions of the liner layers 128, 120 and 132 selectively relative to the surrounding materials and structures. These operations result in the formation of a plurality of cavities 170 for later forming fully self-aligned bottom source/drain contacts, the exposure of the high-k gate insulation layer 154 and a portion of the upper surface of the lower source/drain structure 110. The mask layer 162 may be removed before, after or as part of the etching processes that are performed to remove the materials to define the cavities 170.

FIG. 2P depicts the IC product 100 after one or more timed recess etching processes were performed to remove portions of the gate insulation layer 152. More specifically, portions of the gate insulation layer 152 positioned vertically between the gate electrode 154 and the top S/D region 142 will be removed to define a top spacer recess 152R1 while portions of the gate insulation layer 152 positioned vertically between the gate electrode 154 and the bottom S/D region 110 will be removed to define a bottom spacer recess 152R2. Importantly, at the completion of this recess etching process, a portion 152X of the original gate insulation layer 152 remains positioned between the gate electrode 154 and at least a portion of the side surfaces 108Z and the end surfaces 108Y of the vertically oriented channel semiconductor structures 108. The portion 152X of the gate insulation layer 152 will serve (in whole or part) as the final gate insulation layer for the final gate structure of the devices 101. In one illustrative embodiment, this high-k recess etching process may be performed using an etching chemistry that comprises $CL_2$ and $BCl_3$. In one illustrative embodiment, performing this recess etching process on the gate insulation layer 152 so as to form the top spacer recess 152R1 may result in the exposure of at least a portion of the bottom surface of the top S/D structure 142 and at least a portion of the upper surface of the gate electrode 154. Similarly, in one illustrative embodiment, formation of the bottom spacer recess 152R2 may result in the exposure of at least a portion of the upper surface of the bottom S/D structure 110 and at least a portion of the bottom surface of the gate electrode 154.

FIG. 2Q depicts the IC product 100 after an insulating structure 172 comprised of an insulating material, such as a low-k insulating material was formed on the IC product 100. FIG. 2Q contains an additional X-X view that is annotated to describe certain aspects of the insulating structure 172. The insulating structure 172 may be formed by performing one or more conformal deposition processes to deposit the material for the insulating structure 172 simultaneously in the top spacer recess 152R1, in the bottom spacer recess 152R2 and on the outer perimeter 154P of the gate electrode 154. Thereafter, in one illustrative example, an anisotropic etching process was performed on the material for the insulating structure 172 so as to result in the final insulating structure 172 depicted in the drawing. The formation of the insulating structures 172 result in the definition of a plurality of contact openings 174 wherein a portion of the bottom S/D structure 110 is exposed at the bottom of the openings 174. As will be appreciated by those skilled in the art after a complete reading of the present application, the formation of the insulating structure 172 effectively surrounds the portions of the gate electrode material 154 not covered by the high-k gate insulation layer portion 152X. As shown in the upper "X-X" view in FIG. 2Q, the insulating structure 172 effectively comprises a top spacer portion 172A and a bottom spacer portion 172B, while the remaining portion of the insulating structure 172 defines a gate cap 172C that is positioned around the outer perimeter of the final the gate structure for the device 101. As depicted, the material for the top spacer 172A and the bottom spacer 172B are formed at the same time by performing a common deposition process. In the depicted example, the material for the gate cap 172C is also formed during this common deposition process and the top spacer 172A, the bottom spacer 172B and the gate cap 172C are all comprised of the same material(s), e.g., the same low-k material, and they constitute a single unitary and contiguous structure. Further note that, in the depicted example, the top spacer 172A is formed on and in contact with both a portion of the gate electrode 154 and the lower surface of the top source/drain (S/D) region 142 while the bottom spacer 172B is formed on and in contact with both a portion of the gate electrode 154 and the upper surface of the bottom source/drain region 110.

FIG. 2R depicts the IC product 100 after conductive contact structures 176 were formed in the contact openings 174 so as to establish electrical contact with the bottom S/D structure 110. The conductive contact structures 176 may be formed by depositing any of a variety of different conductive materials so as to overfill the openings 174 and thereafter performing a CMP process to remove excess conductive material positioned outside of the openings 174. The contacts 176 are intended to be representative in nature in that they are intended to represent any type of conductive materials that may be used in forming conductive structures on integrated circuit products, e.g., tungsten, copper, etc. Moreover, the contacts 176 may comprise one or more barrier layers (not shown). At this point in the process flow, traditional metallization layers (not shown) may be formed above the IC product 100 so as to establish electrical connections to the contacts 176.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
    forming a gate structure around a vertically oriented channel semiconductor structure above a bottom source/drain (S/D) region and below a top source/drain (S/D) region, said gate structure comprising a gate electrode and a gate insulation layer, a first portion of said gate insulation layer being positioned between said gate electrode and said vertically oriented channel semiconductor structure;
    removing a second portion and a third portion of said gate insulation layer while leaving at least some of said first portion in position, wherein removal of said second portion defines a top spacer recess between said gate electrode and at least a portion of said top source/drain (S/D) region and removal of said third portion defines a lower spacer recess between said gate electrode and at least a portion of said bottom source/drain (S/D) region; and
    performing a common deposition process to simultaneously form a top spacer in said top spacer recess and a lower spacer in said lower spacer recess.

2. The method of claim 1, wherein said gate insulation layer comprises a high-k (k value of 10 or greater) insulating material and wherein said gate electrode comprises at least one layer comprising a metal.

3. The method of claim 1, wherein performing said common deposition process also simultaneously forms a gate cap material around an outer perimeter surface of said gate structure.

4. The method of claim 3, further comprising performing an etching process to remove a portion of said gate cap material so as to define a final gate cap structure positioned around said outer perimeter surface of said gate structure.

5. The method of claim 1, wherein forming said gate structure comprises:
    forming a layer of sacrificial gate material on said bottom source/drain (S/D) region and around said vertically oriented channel semiconductor structure;
    forming said top source/drain (S/D) region above said layer of sacrificial gate material and on and around an upper portion of said vertically oriented channel semiconductor structure;
    removing said sacrificial gate material to expose said outer perimeter surface of said vertically oriented channel semiconductor structure between said top source/drain (S/D) region and said bottom source/drain (S/D) region and thereby define a gate cavity; and
    forming said gate structure in said gate cavity around said exposed outer perimeter surface of said vertically oriented channel semiconductor structure.

6. The method of claim 1, wherein said top spacer is formed on and in contact with said gate electrode and on and in contact with said upper source/drain (S/D) region and wherein said lower spacer is formed on and in contact with said gate electrode and on and in contact with said bottom source/drain (S/D) region.

7. The method of claim 5, wherein forming said top source/drain (S/D) region comprise performing at least one epi deposition process to form said top source/drain (S/D) region.

8. The method of claim 1, wherein said top spacer and said lower spacer comprises a low-k (k value of 7 or less) insulating material.

9. The method of claim 1, wherein said bottom source/drain (S/D) region is formed by performing at least one ion implantation process.

10. The method of claim 5, wherein, prior to forming said top source/drain (S/D) region above said layer of sacrificial gate material, the method further comprises:
    performing a recess etching process on said layer of sacrificial gate material such that it has a recessed upper surface that is positioned at a level that is below a level of an upper surface of said vertically oriented channel semiconductor structure;
    forming a spacer around an upper portion of said vertically oriented channel semiconductor structure, wherein a bottom of said spacer contacts said recessed upper surface of said layer of sacrificial gate material; and
    performing an anisotropic etching process on said layer of sacrificial gate material so as to remove portions of said layer of sacrificial gate material and thereby define a sacrificial gate structure having a recessed upper surface, wherein said top source/drain (S/D) region is formed on and in contact with said recessed upper surface of said sacrificial gate structure.

11. A method of forming a vertical transistor device, the method comprising:
    forming a gate structure around a vertically oriented channel semiconductor structure above a bottom source/drain (S/D) region and below a top source/drain (S/D) region, said gate structure comprising a gate electrode and a high-k (k value of 10 or greater) gate insulation layer, a first portion of said high-k gate insulation layer being positioned between said gate electrode and said vertically oriented channel semiconductor structure;
    removing a second portion and a third portion of said high-k gate insulation layer while leaving at least some of said first portion of said high-k gate insulation layer in position, wherein removal of said second portion defines a top spacer recess between said gate electrode and at least a portion of said top source/drain (S/D) region and removal of said third portion defines a lower spacer recess between said gate electrode and at least a portion of said bottom source/drain (S/D) region; and performing a common deposition process to simultaneously form a top spacer in said top spacer recess, a lower spacer in said lower spacer recess and a gate cap material around an outer perimeter surface of said gate structure, wherein said top spacer, said lower spacer and said gate cap material comprise a low-k (k value of 7 or less) material.

12. The method of claim 11, further comprising performing an etching process to remove a portion of said gate cap material so as to define a final gate cap structure positioned around said outer perimeter surface of said gate structure.

13. The method of claim 12, wherein forming said gate structure comprises:

forming a layer of sacrificial gate material on said bottom source/drain (S/D) region and around said vertically oriented channel semiconductor structure;

forming said top source/drain (S/D) region above said layer of sacrificial gate material and on and around an upper portion of said vertically oriented channel semiconductor structure;

removing said sacrificial gate material to expose said outer perimeter surface of said vertically oriented channel semiconductor structure between said top source/drain (S/D) region and said bottom source/drain (S/D) region and thereby define a gate cavity; and forming said gate structure in said gate cavity around said exposed outer perimeter surface of said vertically oriented channel semiconductor structure.

14. The method of claim 13, wherein said top spacer is formed on and in contact with said gate electrode and on and in contact with said upper source/drain (S/D) region and wherein said lower spacer is formed on and in contact with said gate electrode and on and in contact with said bottom source/drain (S/D) region.

15. The method of claim 13, wherein, prior to forming said top source/drain (S/D) region above said layer of sacrificial gate material, the method further comprises:

performing a recess etching process on said layer of sacrificial gate material such that it has a recessed upper surface that is positioned at a level that is below a level of an upper surface of said vertically oriented channel semiconductor structure;

forming a spacer around an upper portion of said vertically oriented channel semiconductor structure, wherein a bottom of said spacer contacts said recessed upper surface of said layer of sacrificial gate material; and performing an anisotropic etching process on said layer of sacrificial gate material so as to remove portions of said layer of sacrificial gate material and thereby define a sacrificial gate structure having a recessed upper surface, wherein said top source/drain (S/D) region is formed on and in contact with said recessed upper surface of said sacrificial gate structure.

\* \* \* \* \*